(12) United States Patent
Wang et al.

(10) Patent No.: US 11,843,380 B2
(45) Date of Patent: Dec. 12, 2023

(54) CONTACTOR, AND DEVICE AND METHOD FOR CONTROLLING SAME

(71) Applicant: SCHNEIDER ELECTRIC INDUSTRIES SAS, Rueil Malmaison (FR)

(72) Inventors: Jiezhao Wang, Shanghai (CN); Vincent Geffroy, Shanghai (CN); Zifang Mao, Shanghai (CN); Yongpeng Jia, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 25 days.

(21) Appl. No.: 17/787,388

(22) PCT Filed: Dec. 18, 2020

(86) PCT No.: PCT/CN2020/137701
§ 371 (c)(1),
(2) Date: Jun. 20, 2022

(87) PCT Pub. No.: WO2021/121401
PCT Pub. Date: Jun. 24, 2021

(65) Prior Publication Data
US 2023/0029408 A1   Jan. 26, 2023

(30) Foreign Application Priority Data
Dec. 20, 2019 (CN) .............................. 201911330800

(51) Int. Cl.
*H03K 3/012* (2006.01)
*H03K 17/56* (2006.01)

(52) U.S. Cl.
CPC ............ *H03K 3/012* (2013.01); *H03K 17/56* (2013.01); *H03K 2217/0063* (2013.01); *H03K 2217/0072* (2013.01)

(58) Field of Classification Search
CPC ........... H03K 3/012; H03K 2217/0072; H03K 2217/0063; H03K 17/56; H01H 47/32; H02M 1/36
See application file for complete search history.

(56) References Cited

U.S. PATENT DOCUMENTS 6,317,308 B1 *  11/2001  Durif .................. H01H 47/002
                                                          361/160
7,593,212 B1 *   9/2009  Toth .................... G05D 23/1902
                                                          361/160
(Continued)

FOREIGN PATENT DOCUMENTS

CN       201698964 U      1/2011
CN       104868770 A      8/2015
(Continued)

OTHER PUBLICATIONS

International Search Report dated Mar. 17, 2021 for International Patent Application No. PCT/CN2020/137701, 9 pages.

*Primary Examiner* — Patrick C Chen
(74) *Attorney, Agent, or Firm* — Locke Lord LLP (57) ABSTRACT

The present disclosure relates to contactor, and device and method for controlling same. A control device for a contactor comprises a high side control unit, a first low side control unit, a second low side control unit, a freewheeling unit, and a controller. The high side control unit is configured to switch on or switch off the connection of the first magnetic unit and the second magnetic unit of the contactor with a power supply. The first low side control unit is configured to switch on or switch off the connection of the first magnetic unit with the reference voltage node. The second low side control unit is configured to switch on or switch off the connection of the second magnetic unit with the reference voltage node. The freewheeling unit is connected across a branch comprising a first magnetic unit and a first low side (Continued)

control unit and connected across a branch comprising a second magnetic unit and a second low side control unit. The controller is configured to control the operation of the high side control unit, the first low side control unit, and the second low side control unit. Embodiments of the present disclosure may enable intelligent control of contactors with simple control logic.

18 Claims, 5 Drawing Sheets

(56) References Cited

U.S. PATENT DOCUMENTS

| | | | |
|---|---|---|---|
| 9,866,130 B1* | 1/2018 | Choi | H02M 3/33573 |
| 11,451,138 B2* | 9/2022 | Alfawy | H02M 1/38 |
| 2016/0314919 A1 | 10/2016 | Broker et al. | |
| 2020/0328684 A1* | 10/2020 | Escudero Rodriguez | H02M 1/32 |

FOREIGN PATENT DOCUMENTS

| | | |
|---|---|---|
| CN | 205487948 U | 8/2016 |
| CN | 209461383 U | 10/2019 |

* cited by examiner

CONTACTOR, AND DEVICE AND METHOD FOR CONTROLLING SAME

FIELD

The present disclosure relates to electronic devices, and more particularly to contactors, and devices and methods for controlling contactors.

BACKGROUND

A contactor is an apparatus for switching the circuit on and off. Since contactors can frequently switch on and off large current control circuits, contactors are often used to control motors. In addition, contactors may also be used to control electrical loads such as plant equipment, lighting equipment, coworkers, various power plants, and the like. Contactors are suitable for frequent operation and remote control, which is one of the essential elements in an automated control system.

The working principle of the contactor is as follows. When the contactor coil is energized, the coil current may generate a magnetic field. The generated magnetic field causes the static magnetic core to generate electromagnetic suction to attract the movable magnetic core. The movement of the movable magnetic core drives the movement of the movable contact, causing the contacts to close, thereby completing the loop controlled by the contactor. When the coil is de-energized, the electromagnetic attraction disappears, causing the contact to open, thereby severing the loop controlled by the contactor.

A greater pull-in force is required when the contacts are engaged while maintaining the electrical contact requires only a smaller pull-in force. Conventional contactors simply employ one switch to control one coil. The current flowing through the coil is uncontrolled in such a technical solution. For reliable pull-in of the contactor, a larger current must be ensured to flow through the coil. The coil also maintains a larger current for a long period of time after the contactor is engaged. This is not only energy intensive, but also causes coil heating, or even destruction. The use of only one switch causes control of the contactor to be limited. The state of the contactor switches frequently, causing the movable contacts to strike the stationary contacts frequently. As a result, the contacts are susceptible to damage, with a short life.

Also proposed in the art is a flyback circuit based coil control scheme. However, such a technical solution is complex and costly. In addition, there is a need for a buck circuit designed to hold the coil. The design difficulty of the buck circuit is large and the validation period is long.

SUMMARY

Accordingly, there is a need to further improve the control of contactors and their coils to address or at least partially address the above and other potential problems in the prior art.

In a first aspect of the disclosure, a control device for a contactor is provided that comprises: a high side control unit configured to switch on or switch off the connection of a first magnetic unit and a second magnetic unit of the contactor with a power supply; a first low side control unit configured to switch on or switch off the connection of the first magnetic unit with a reference voltage node; a second low side control unit configured to switch on or switch off the connection of the second magnetic unit with the reference voltage node; a freewheeling unit connected across a branch comprising the first magnetic unit and the first low side control unit, and connected across a branch comprising the second magnetic unit and the second low side control unit; and a controller configured to control operations of the high side control unit, the first low side control unit, and the second low side control unit to cause the control device to operate in an inrush phase in which current flows through the first magnetic unit, and a hold phase in which current flows through the second magnetic unit.

Optionally, in some embodiments, the control device further comprises: a first current monitor configured to monitor a first current flowing through the first magnetic unit, wherein the controller is configured to control the operation of the high side control unit or the first low side control unit based on the first current.

Optionally, in some embodiments, the control device further comprises: a second current monitor configured to monitor a second current flowing through the second magnetic unit, wherein the controller is configured to control the operation of the high side control unit based on the second current.

Optionally, in some embodiments, the freewheeling unit comprises a first freewheeling unit and a second freewheeling unit, the first freewheeling unit is connected across a branch comprising the first magnetic unit and the first low side control unit, and the second freewheeling unit is connected across a branch comprising the second magnetic unit and the second low side control unit.

Optionally, in some embodiments, the freewheeling unit comprises a freewheeling diode.

Optionally, in some embodiments, the first magnetic unit comprises a first coil; the second magnetic unit comprises a second coil; the high side control unit comprises a high side switch connected between the first coil and the second coil and the power supply; the first low side control unit comprises a first low side switch connected between the first coil and the reference voltage node; and the second low side control unit comprises a second low side switch connected between the second coil and the reference voltage node.

Optionally, in some embodiments, the control device further comprises a first voltage regulation unit and a second voltage regulation unit, the first voltage regulation unit is connected between the first magnetic unit and the reference voltage node, and the second voltage regulation unit is connected between the second magnetic unit and the reference voltage node.

In a second aspect of the disclosure, a contactor is provided that comprises a control device according to the first aspect of the disclosure.

In a third aspect of the present disclosure, a method of controlling a contactor is provided that comprises: controlling a first low side control unit to switch on a connection of a first magnetic unit of the contactor with a reference voltage node; controlling a high side control unit to switch on a connection of the first magnetic unit with a power supply such that current flows through the first magnetic unit; controlling the high side control unit to switch off the connection of the first magnetic unit with the power supply such that current flows in the first magnetic unit via a freewheeling unit; and controlling a second low side control unit to switch on the connection of a second magnetic unit of the contactor with the reference voltage node such that current flows in the second magnetic unit via the freewheeling unit.

Optionally, in some embodiments, the method further comprises controlling the high side control unit to switch on the connection of the second magnetic unit with the power supply in a state in which the connection of the second magnetic unit to the reference voltage node is switched on.

Optionally, in some embodiments, the method further comprises controlling the high side control unit to switch off the connection of the second magnetic unit with the power supply such that current flows in the second magnetic unit via the freewheeling unit.

Optionally, in some embodiments, the method further comprises controlling the first low side control unit to switch off the connection of the first magnetic unit with the reference voltage node in response to the first current flowing through the first magnetic unit being below the first threshold.

Optionally, in some embodiments, controlling the high side control unit to switch on the connection of the second magnetic unit with the power supply while the connection of the second magnetic unit to the reference voltage node is switched on comprises controlling the high side control unit to switch on the connection of the second magnetic unit with the power supply in response to a second current flowing through the second magnetic unit being greater than a second threshold.

Optionally, in some embodiments, the method further comprises controlling an operation of the high side control unit based on the current flowing through the first magnetic unit.

Optionally, in some embodiments, the method further comprises controlling the operation of the high side control unit based on the current flowing through the second magnetic unit.

Optionally, in some embodiments, the method further comprises controlling the high side control unit by using a pulse width modulated signal.

Optionally, in some embodiments, the method further comprises adjusting a duty cycle of the pulse width modulated signal based on at least one of the first current flowing through the first magnetic unit and the second current flowing through the second magnetic unit.

Optionally, in some embodiments, the freewheeling unit comprises a first freewheeling unit and a second freewheeling unit, wherein after controlling the high side control unit to switch off the connection of the first magnetic unit with the power supply, current flows in the first magnetic unit via the first freewheeling unit , and wherein after controlling the second low side control unit to switch on the connection of the second magnetic unit of the contactor with the reference voltage node, current flows in the second magnetic unit via the second freewheeling unit.

The present disclosure employs two magnetic units. In a holding phase following the inrush phase, the current flowing through the second magnetic unit may be made smaller. At the same time, with the freewheeling unit, it is also possible to keep the current flowing in the magnetic unit without drawing power from the power supply. The contactor of the present disclosure thus has lower power consumption. Furthermore, the present disclosure uses a single high side control unit to control both magnetic units, thereby simplifying equipment, saving cost, and providing relatively simple control logic.

It is understood that the Summary is not intended to identify key or essential features of the embodiments of the disclosure nor is it intended to be used to limit the scope of the disclosure. Other features of the present disclosure will become apparent from the following description.

BRIEF DESCRIPTION OF THE DRAWINGS

The foregoing and other objects, features and advantages of the disclosure will become more apparent from the following more particular descriptions of exemplary embodiments of the disclosure as illustrated in the accompanying drawings. The same or similar reference numbers are used throughout the drawings to refer to the same or like parts.

DETAILED DESCRIPTION OF EMBODIMENTS

Preferred embodiments of the present disclosure will now be described more fully hereinafter with reference to the accompanying drawings. While preferred embodiments of the disclosure are shown in the drawings, it is to be understood that the disclosure may be embodied in various forms and should not be limited by the embodiments set forth herein. Rather, these embodiments are provided such that this disclosure will be thorough and complete, and will fully convey the scope of the disclosure to those skilled in the art.

As used herein, the term "comprising" and variations thereof mean open-ended inclusion, i.e., "comprising but not limited to". The term "or" means "and/or" unless specifically stated otherwise. The term "based on" means "based at least in part on". The terms "an example embodiment" and "one embodiment" mean "at least one example embodiment". The term "another embodiment" means "at least one additional embodiment". The terms "first", "second", and so forth, may refer to different or the same object. Other explicit and implicit definitions may be included below.

The present disclosure proposes an improved apparatus and method for controlling a contactor. The present disclosure employs a single high side control unit to control both the inrush coil and the hold-in coil. Not only can this control the current through the coil, but the control logic is relatively simple.

Figure 1:
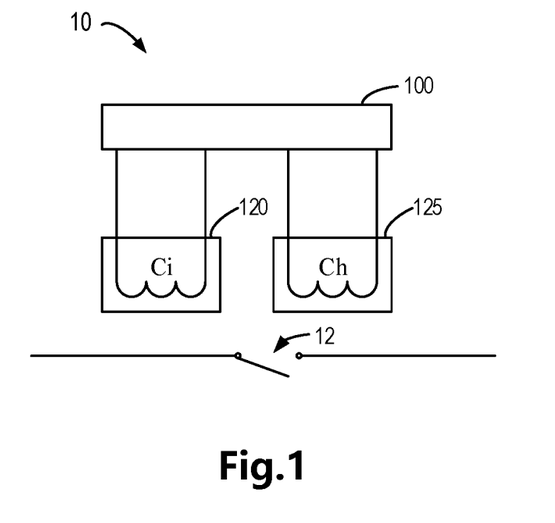
FIG. 1 illustrates a schematic diagram of a contactor according to one embodiment of the present disclosure.

FIG. 1 illustrates a schematic diagram of a contactor 10 according to one embodiment of the present disclosure. It is appreciated that the structure and function of the contactor 10 are described for exemplary purposes only and do not imply any limitations on the scope of the disclosure. Embodiments of the present disclosure may be embodied in contactors having different structure and/or functionality.

As shown in FIG. 1, the contactor 10 comprises a first magnetic unit 120 and a second magnetic unit 125. The first magnetic unit 120 comprises a first coil Ci (also referred to as inrush coil Ci). The second magnetic unit 125 comprises a second coil Ch (also referred to as a holding coil Ch). The first magnetic unit 120 and the second magnetic unit 125 may also include a static magnetic core, a movable magnetic core, and other related components. In one embodiment, the first magnetic unit 120 and the second magnetic unit 125 may include a common the static magnetic core and the movable magnetic core.

The contactor 10 works as follows. When current flows through either of the inrush coil Ci and the hold-in coil Ch, the coil current generates a magnetic field. The generated magnetic field causes the static magnetic core to generate an electromagnetic suction force to attract the movable magnetic core. The movement of the movable magnetic core drives the movement of the movable contact such that the contact 12 closes, thereby completing the loop in which the contact 12 is located. The contacts 12 may be located in a main loop of an electrical device such as a motor. When there is no current in both the inrush coil Ci and the hold-in coil Ch, the electromagnetic attraction disappears, causing the contact 12 to open, thereby severing the circuit controlled by the contactor 10.

FIG. 1 also shows a control device 100 for controlling the contactor 10. The control device 100 may control the current flowing through the first magnetic unit 120 and the second magnetic unit 125, in particular through the inrush coil Ci and the hold-in coil Ch, thereby controlling the closing and opening of the contacts 12.

Figure 2:
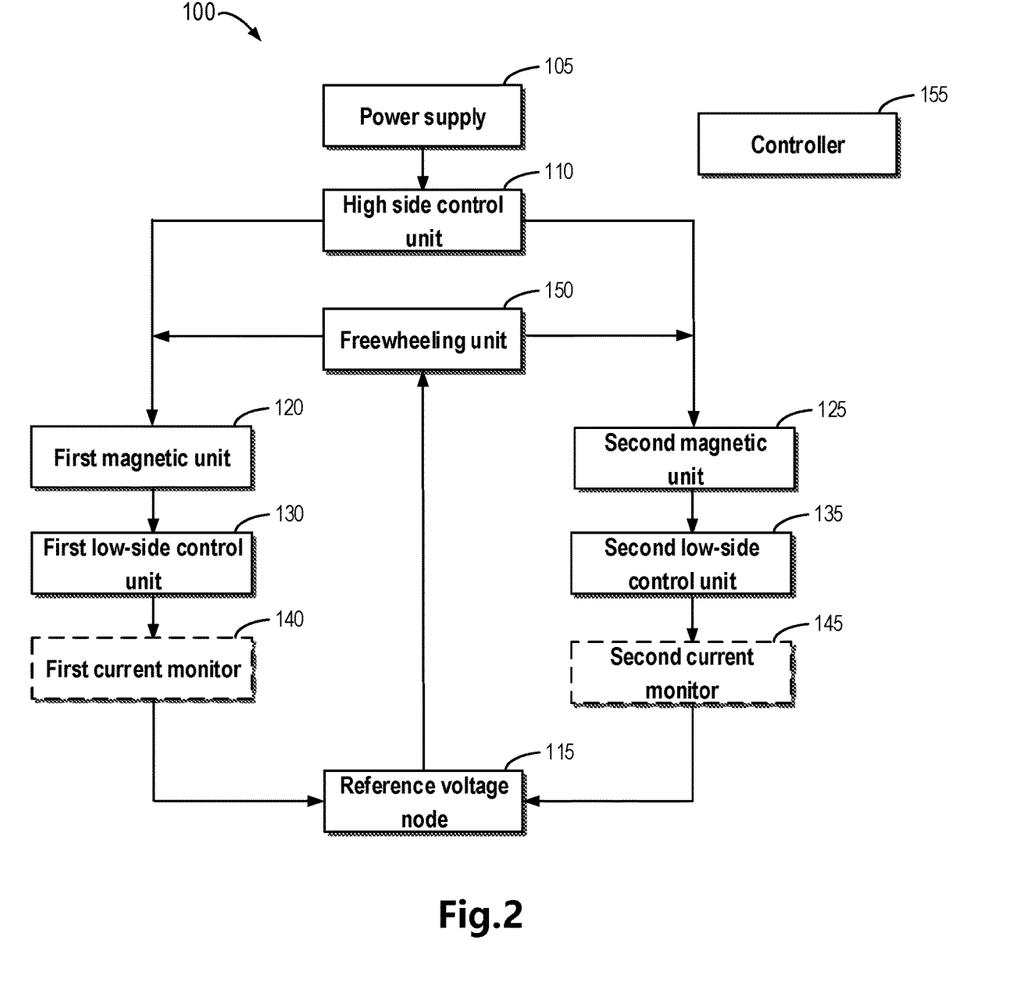
FIG. 2 illustrates a functional block diagram of a control device for a contactor according to one embodiment of the present disclosure.

FIG. 2 illustrates a functional block diagram of a control device 100 for a contactor according to one embodiment of the present disclosure. It is appreciated that the control device 100 may also include additional blocks not shown and/or may omit blocks shown, the scope of the disclosure is not limited in this regard. The dashed boxes shown in FIG. 2 represent optional blocks of the control device 100.

As shown in FIG. 2, the control device 100 for the contactor 10 generally comprises a high side control unit 110, a first low side control unit 130, and a second low side control unit 135. The high side control unit 110 is connected between the first and second magnetic units 120 and 125 and the power supply 105, and is configured to switch on or switch off the connection of the first and second magnetic units 120 and 125 with the power supply 105. The first low side control unit 130 is connected between the first magnetic unit 120 and the reference voltage node 115 and is configured to switch on or switch off the connection of the first magnetic unit 120 with the reference voltage node 115. The second low side control unit 135 is connected between the second magnetic unit 125 and the reference voltage node 115 and is configured to switch on or switch off the connection of the second magnetic unit 125 with the reference voltage node 115. In addition, the control device 100 comprises a controller 155. The controller 155 is configured to control the operation of the high side control unit 110, the first low side control unit 130 and the second low side control unit 135 in order to switch the circuit on and off.

Control device 100 may operate in at least two phases: an inrush phase and a hold phase. Current flows through first magnetic unit 120 in the inrush phase and current flows through second magnetic unit 125 in the hold phase. Specifically, in the inrush phase, high side control unit 110 may switch on the connection of first magnetic unit 120 with power supply 105, and first low side control unit 130 may switch on the connection of first magnetic unit 120 with reference voltage node 115. A current is generated from the power supply 105 through the high side control unit 110, the first magnetic unit 120 and the first low side control unit 130 to the reference voltage node 115. As a result of current flowing through the first magnetic unit 120, an electromagnetic attraction force may be generated, thereby closing the contact 12 (i.e., bringing the contactor 10 into engagement). The inrush phase described above may also be referred to as a start portion of the inrush phase in which first magnetic unit 120 stores energy by obtaining power from power supply 105.

In the hold phase, the high side control unit 110 may switch on the connection of the second magnetic unit 125 with the power supply 105, and the second low side control unit 135 may switch on the connection of the second magnetic unit 125 with the reference voltage node 115. A current is generated from power supply 105 through high side control unit 110, second magnetic unit 125 and second low side control unit 135 to reference voltage node 115. Due to the current flowing through the second magnetic unit 125, an electromagnetic attraction force may be generated, thereby closing the contact 12. The hold phase described above may also be referred to as a sustain portion of the hold phase, in which the second magnetic unit 125 stores energy by obtaining power from the power supply 105.

By using two magnetic units, a greater current may be provided to the first magnetic unit 120 during the inrush phase, thereby creating a greater electromagnetic attraction to ensure that the contact 12 can transition from the open state to the closed state. Only a small electromagnetic suction force is needed to keep the contacts 12 closed after the contacts 12 have been closed. Thus, less current may be provided to the second magnetic unit 125 in the holding phase to hold the contacts 12 closed. Since the current flowing through the second magnetic unit 125 in the holding phase is small, the advantage of energy saving can be achieved.

Furthermore, the present disclosure uses a single high side control unit 110 to control both the first magnetic unit 120 and the second magnetic unit 125 such that the control device 100 can be simplified. This may not only save cost, but also make the associated control logic relatively simple.

Control device 100 may also include a freewheeling unit 150. As shown in FIG. 2, freewheeling unit 150 is connected across a branch comprising the first magnetic unit 120 and the first low side control unit 130, and is connected across a branch comprising the second magnetic unit 125 and the second low side control unit 135.

With freewheeling unit 150, the inrush stage of control device 100 may also include a freewheeling portion. In the freewheeling portion of the inrush phase, the high side control unit 110 switches off the connection of the first magnetic unit 120 with power supply 105. At this time, the first magnetic unit 120 releases energy. Current will flow from the first magnetic unit 120, through the first low side control unit 130, the optional first current monitor 140, the reference voltage node 115, the freewheeling unit 150, back to the first magnetic unit 120. Similarly, the hold stage of control device 100 may also include a freewheeling portion. In the freewheeling portion of the hold stage, the high side control unit 110 switches off the connection of the second magnetic unit 125 with the power supply 105. At this time, the second magnetic unit 125 starts to release energy. Current will flow from the second magnetic unit 125, through the second low side control unit 135, the optional second current monitor 145, the reference voltage node 115, the freewheeling unit 150, back to the second magnetic unit 125.

In the freewheeling portion of the inrush phase or the freewheeling portion of the hold phase, the first magnetic unit 120 or the second magnetic unit 125 does not draw power from power supply 105. However, the energy stored in the first magnetic unit 120 or the second magnetic unit 125 causes current to continue to flow in the first magnetic unit 120 or the second magnetic unit 125 via the freewheeling unit 150. Thus, electromagnetic suction may still be provided to keep the contacts 12 closed. In this manner, the energy stored in the magnetic unit is efficiently utilized, avoiding waste of energy. The closing of the contacts 12 may be maintained without drawing power from the power supply 105, thus further saving energy.

The power supply 105 may be a DC power supply. Alternatively, the power supply 105 may be an AC power supply. In this case, a rectifying unit may be provided between the power supply 105 and the high side control unit 110. For example, the power supply 105 may be a bus. The reference voltage node 115 may be ground. The first magnetic unit 120 and the second magnetic unit 125 may be magnetically coupled to each other. Therefore, energy can also be stored in the second magnetic unit 125 in a case where current flows through the first magnetic unit 120 but the second low side control unit 135 is not switched on. The impedance of the first magnetic unit 120 may be smaller than the impedance of the second magnetic unit 125 so as to be suitable for providing larger currents.

Optionally, as shown in FIG. 2, the control device 100 may also include a first current monitor 140 and a second current monitor 145. The first current monitor 140 is configured to monitor a current (also referred to as a first current) flowing through the first magnetic unit 120. The second current monitor 145 is configured to monitor a current (also referred to as a second current) flowing through the second magnetic unit 125. Controller 155 may control operations of high side control unit 110, the first low side control unit 130, and the second low side control unit 135 based on the first current and/or the second current. In this way, the control device 100 may enable more intelligent control of the contactor 10.

Figure 3:
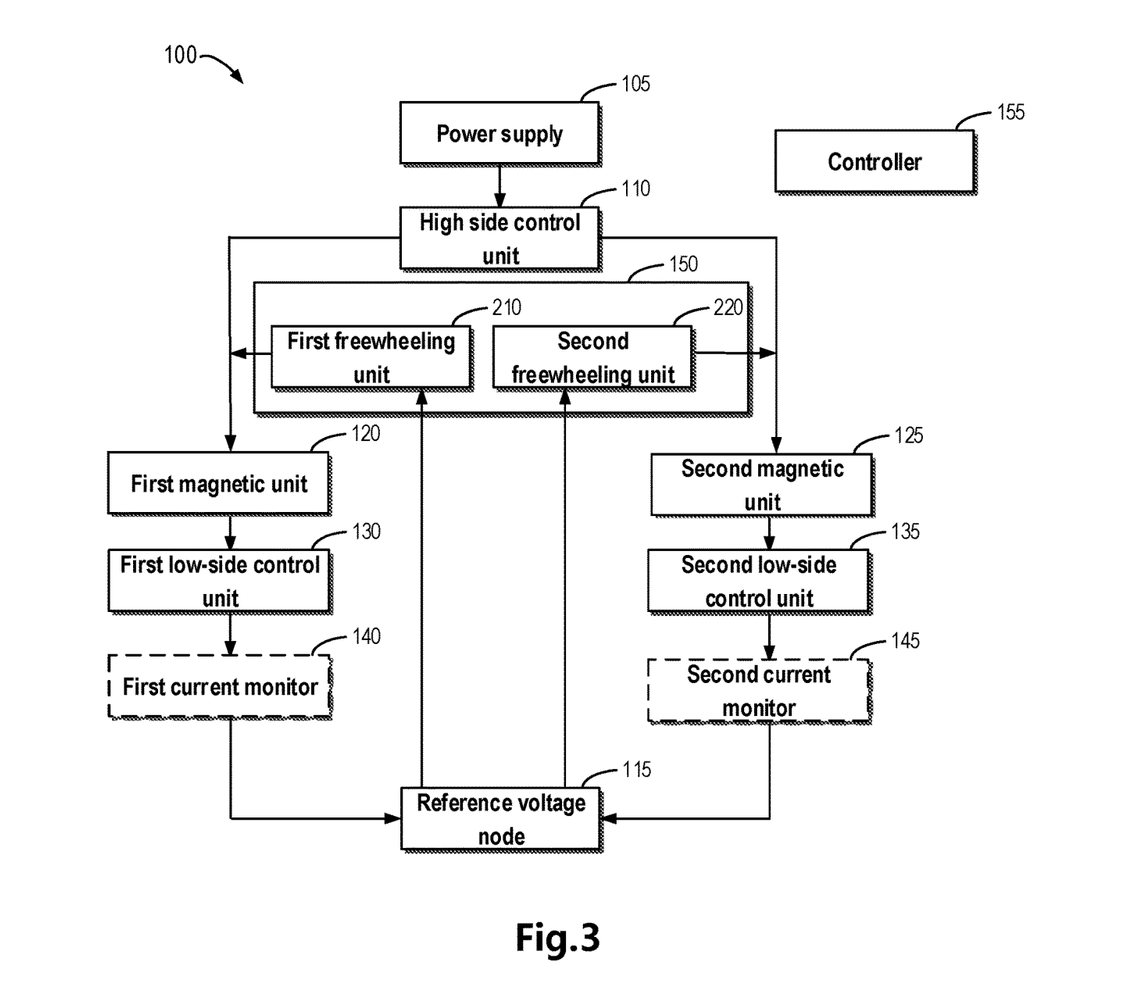
FIG. 3 illustrates a functional block diagram of a control device for a contactor according to another embodiment of the present disclosure.

FIG. 3 illustrates a functional block diagram of a control device 100 for a contactor according to another embodiment of the present disclosure. Control device 100 shown in FIG. 3 is substantially the same as control device 100 shown in FIG. 2 except that freewheeling unit 150 comprises a first freewheeling unit 210 and a second freewheeling unit 220. The first freewheeling unit 210 is for the first magnetic unit 120 and the second freewheeling unit 220 is for the second magnetic unit 125. Specifically, the first freewheeling unit 210 is connected across a branch comprising the first magnetic unit 120 and the first low side control unit 130, and the second freewheeling unit 220 is connected across a branch comprising the second magnetic unit 125 and the second low side control unit 135. Alternatively, the first magnetic unit 120 or the second magnetic unit 125 may share the same freewheeling unit.

Figure 4:
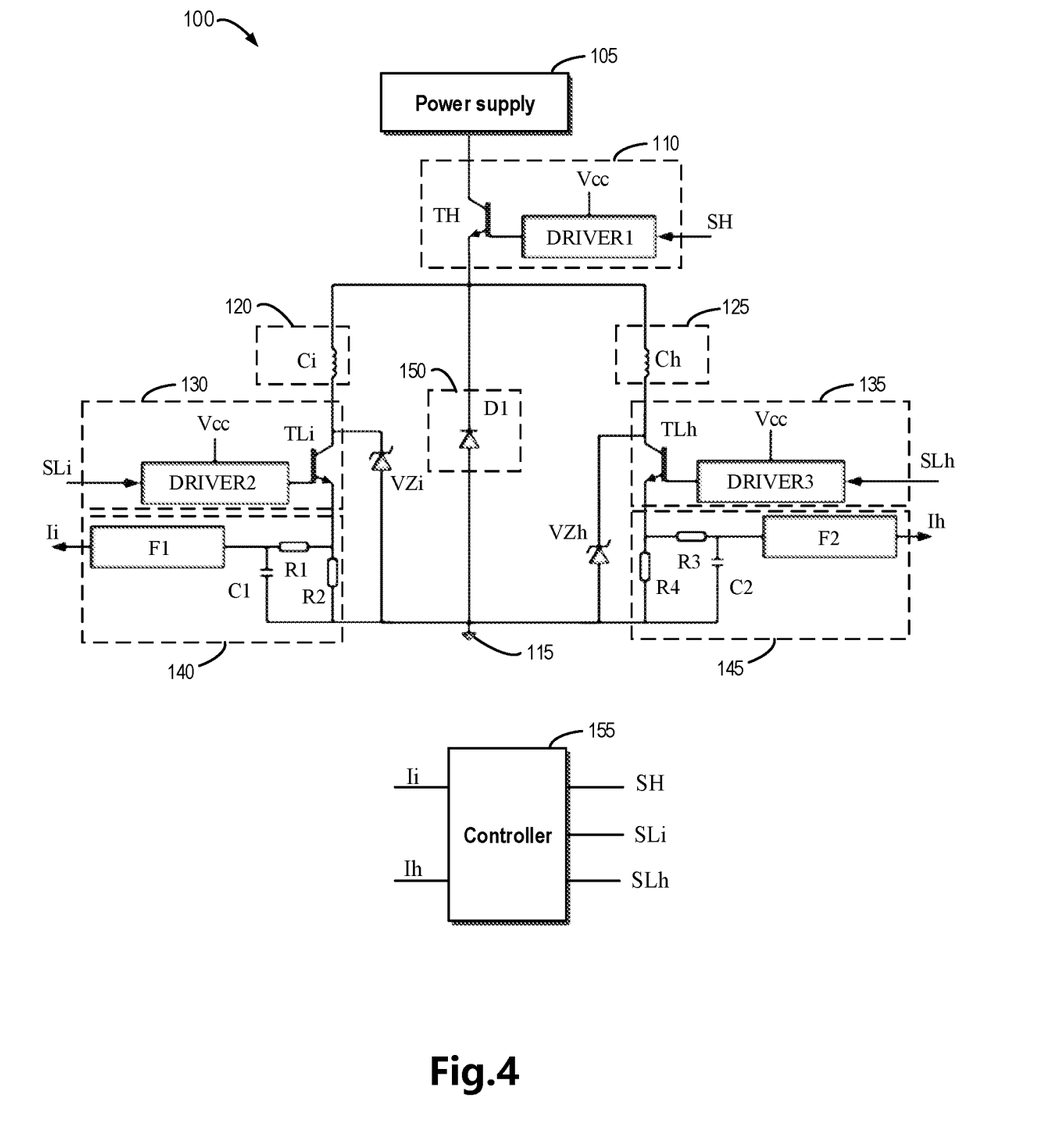
FIG. 4 shows an example circuit for implementing the control device shown in FIG. 2.

FIG. 4 illustrates an example circuit for implementing the control device 100 shown in FIG. 2. For example, the example circuit may be implemented based on a printed circuit board. It is appreciated that the example circuit of FIG. 4 may also include additional components not shown and/or may omit components shown, and the scope of the present disclosure is not limited in this regard. The circuit of FIG. 4 is merely one example, and the control device 100 may also be implemented in other ways.

In FIG. 4, only the first coil Ci of the first magnetic unit 120 and the second coil Ch of the second magnetic unit 125 are shown. As shown in FIG. 4, the high side control unit 110 may include a high side switch TH and a corresponding driving circuit DRIVER1. The high side switch TH is connected between the first and second coils Ci and Ch and the power supply 105. The first low side control unit 130 may include a first low side switch TLi and a corresponding drive circuit DRIVER2. The first low side switch TLi is connected between the first coil Ci and a reference voltage node 115, here ground. The second low side control unit 135 may include a second low side switch TLh and a corresponding drive circuit DRIVER3. The second low side switch TLh is connected between the second coil Ch and the reference voltage node 115.

For example, the high side switch TH, the first low side switch TLi, and the second low side switch TLh may be transistors or thyristors. The transistors referred to herein may be any type of transistor, such as metal-oxide-semiconductor field-effect transistors (MOSFETs) and insulated gate bipolar transistors (IGBTs).

Drive circuits DRIVER1, DRIVER2, and DRIVER3 may be powered by power supply voltage Vcc. For example, the power supply voltage Vcc is 15V. In response to control signals from controller 155, drive circuits DRIVER1, DRIVER2, and DRIVER3 may provide drive voltages to the respective switches, thereby controlling the switching on and off of the switches. Drive circuits DRIVER1, DRIVER2, and DRIVER3 may be implemented by integrated circuits. In one example, the drive circuits DRIVER1 and DRIVER2 may be implemented by the same integrated circuit.

In FIG. 4, freewheeling unit 150 is simply implemented by freewheeling diode D1. However, other implementations of the freewheeling unit 150 are possible, and the invention is not limited in this respect. This freewheeling diode D1 is shared by the first coil Ci and the second coil Ch. The first current monitor 140 may include a voltage divider circuit formed by resistors R1, R2, and a feedback circuit F1. The voltage divider circuit formed by the resistors R1, R2 may provide a voltage signal, and the feedback circuit F1 may convert the voltage signal into the current signal Ii to be provided to the controller 155. The current signal Ii indicates the current flowing through the first magnetic unit 120. Similar to the first current monitor 140, the second current monitor 145 may include a voltage divider circuit formed by resistors R3, R4, and a feedback circuit F2. The voltage divider circuit formed by the resistors R3, R4 may provide a voltage signal, and the feedback circuit F2 may convert the voltage signal into the current signal Ih to be provided to the controller 155. The current signal Ih indicates the current flowing through the second magnetic unit 125. Capacitors C1 and C2 may function as filtering.

Based on the current signal Ih and/or the current signal Ii, the controller 155 generates a control signal SH for the high side control unit 110, a control signal SLi for the first low side control unit 130, and a control signal SLh for the second low side control unit 135. For example, the controller 155 may include a micro control unit (MCU) or a processor.

Optionally, as shown in FIG. 4, the control device 100 may further include a first regulation unit VZi and a second regulation unit VZh. The first regulation unit VZi is connected between the first magnetic unit 120 (in particular, the first coil Ci) and the reference voltage node 115, and the second regulation unit VZh is connected between the second magnetic unit 125 (in particular, the second coil Ch) and the reference voltage node 115. When the first low side switch TLi is switched off, the voltage on the first coil Ci may break down the first regulator unit VZi, such that the first coil Ci releases energy quickly. Similarly, when the second low side switch TLh is switched off, the second stabilizing unit VZh is broken down such that the remaining energy of the second coil Ch is quickly released. The voltage regulation units are shown as Zener diodes in FIG. 4, but it is appreciated that the voltage regulation units of the present disclosure may also be implemented with other elements having Zener protection functionality.

The working state of the control device 100 shown in FIG. 4 will be described below in conjunction with Table 1. Table 1 shows the operational states of the switch shown in FIG. 4, where "0" indicates that the switch is off and "1" indicates that the switch is on.

TABLE 1

Operational States of the Switches

| | High Side Switch TH | First Low Side Switch TLi | Second Low Side Switch TLh |
|---|---|---|---|
| P1 | 0 | 0 | 0 |
| P2 | 0 | 1 | 0 |
| P3 | 1 | 1 | 0 |
| P4 | 0 | 1 | 0 |
| P5 | 0 | 1 | 1 |
| P6 | 0 | 0 | 1 |
| P7 | 1 | 0 | 1 |
| P8 | 0 | 0 | 1 |
| P9 | 0 | 0 | 0 |

As shown in Table 1, in the P1 phase, the high side switch TH, the first low side switch TLi and the second low side switch TLh are switched off. At this stage, the controller 155 may initialize. In phase P2, the controller 155 causes the first low side switch TLi to switch on via the control signal SLi. At this stage, the hardware of the control device 100 may initialize.

In the phase P3, the controller 155 causes the high side switch TH to be switched on by the control signal SH. In this phase, since both the high side switch TH and the first low side switch TLi are switched on, the first coil Ci may draw power from the power supply 105. This phase is part of the start-up portion of the aforementioned inrush phase, during which the current Ii flowing through the first coil Ci is constantly increasing. When the current flowing through the first coil Ci reaches a certain value, the electromagnetic attraction generated is large enough that the contactor 10 snaps.

In phase P4, the high side switch TH is switched off. The high side switch TH may be switched off based on a time threshold. The time threshold may be an empirical value. After a time equal to the time threshold has elapsed, the contacts of the contactor 10 are considered to be stably engaged together such that the high side switch TH may be switched off. At this stage, the current continues to flow in the first coil Ci via the freewheeling diode D1. However, the current Ii flowing through the first coil Ci starts to drop. This stage belongs to the freewheeling portion of the aforementioned inrush stage.

In phase P5, the controller 155 causes the second low side switch TLh to switch on via the control signal SLh. In the previous phase, when there is a current flowing in the first coil Ci, the second low side switch TLh is not switched on, but the second coil Ch stores energy. Therefore, the energy stored in the second coil Ch generates a current after the second low side switch TLh is switched on. This current flows through the loop formed by the freewheeling diode D1, and the current Ih flowing through the second coil Ch rises. In the P5 phase, both the first low side switch TLi and the second low side switch TLh are switched on. Energy is transferred from the first coil Ci to the second coil Ch at a faster rate. Thus, the P5 phase may also be referred to as a transfer phase.

In phase P6, the current Ii flowing through the first coil Ci drops to the first threshold. At this time, the controller 155 switches off the first low side switch TLi via the control signal SLi. As described above, after the first low side switch TLi is switched off, the voltage on the first coil Ci may break down the first regulator unit VZi, thereby rapidly discharging the first coil Ci. In the P6 stage, there is only current flow in the second coil Ch via the freewheeling diode D1. This stage belongs to the freewheeling portion of the holding stage described earlier.

In phase P7, when the current Ih flowing through the second coil Ch rises to a second threshold, the high side switch TH is switched on such that the second coil Ch can gain power from the power supply 105. This phase is part of the hold phase described earlier.

In phase P8, the high side switch TH is switched off. With the energy stored in the previous sustaining portion of the second coil Ch, the current continues to flow in the second coil Ch via the freewheeling diode D1. But the current Ih in the second coil Ch drops. The P8 stage also belongs to the freewheeling portion of the hold stage described earlier.

In phase P9, the second low side switch TLh is switched off. When the current Ih in the second coil Ch drops to a certain level, the electromagnetic attraction generated is insufficient to maintain pull-in of the contactor 10. The contactor 10 will open. Thus, the second low side switch TLh is switched off. The remaining energy in the second low side switch TLh breaks down the second regulator unit VZh and discharges quickly.

Figure 5:
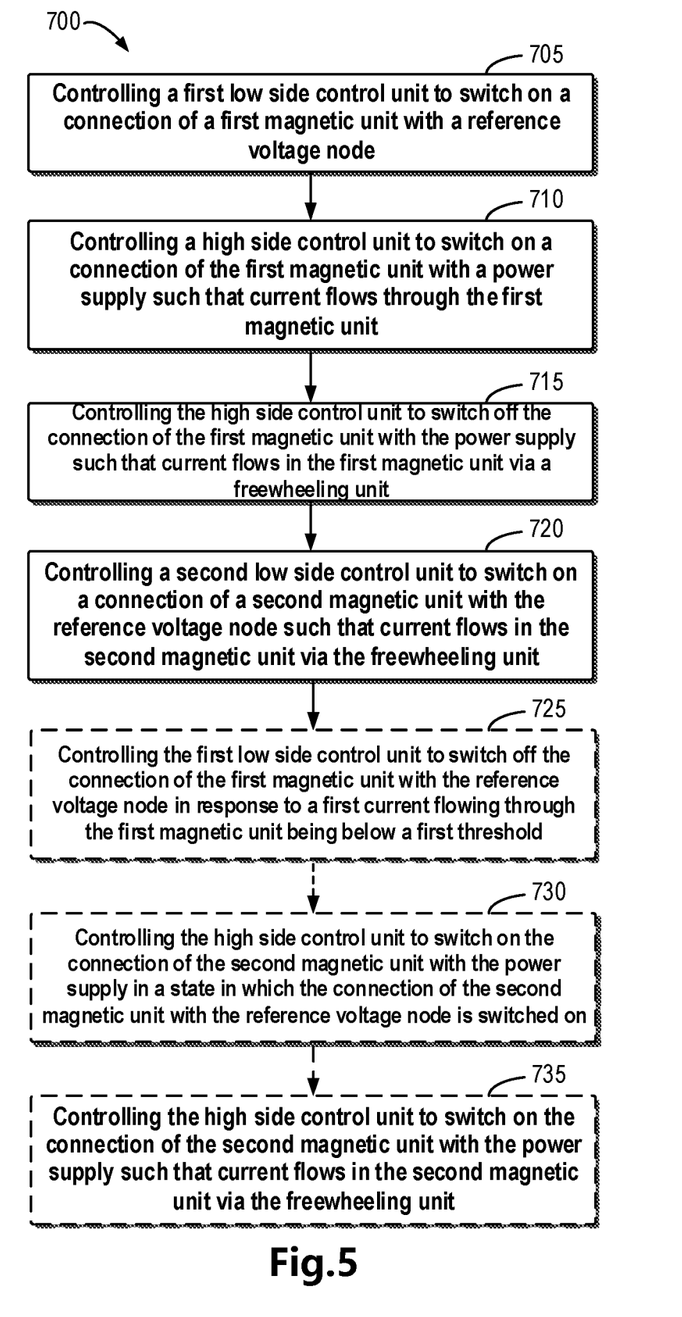
FIG. 5 illustrates a flowchart of a method of controlling a contactor according to one embodiment of the present disclosure.

FIG. 5 illustrates a flowchart of a method 700 of controlling the contactor 10 according to one embodiment of the present disclosure. For example, the method 700 may be performed by controller 155 as shown in FIG. 2, 3, or 4. It is appreciated that the method 700 shown in FIG. 5 may also include additional blocks not shown and/or may omit illustrated blocks, the scope of the present disclosure is not limited in this regard. The dashed boxes shown in FIG. 5 represent optional steps of the method 700, or steps that may be substituted in other ways.

At 705, the controller 155 may control the first low side control unit 130 to switch on the connection of the first magnetic unit 120 with the reference voltage node 115 by sending a control signal SLi to the first low side control unit 130.

At 710, in a state in which the connection of the first magnetic unit 120 to the reference voltage node 115 is switched on, the controller 155 may control the high side control unit 110 to switch on the connection of the first magnetic unit 120 with the power supply 105 by sending the control signal SH to the high side control unit 110 such that the current flows through the first magnetic unit 120.

At 715, the controller 155 controls the high side control unit 110 to switch off the connection of the first magnetic unit 120 with the power supply 105 by controlling the signal SH such that the current in the first magnetic unit 120 flows through the freewheeling unit 150.

At 720, the controller 155 may control the second low side control unit 135 to switch on the connection of the second magnetic unit 125 of the contactor to the reference voltage node 115 by sending a control signal SLh to the second low side control unit 135 such that current flows in the second magnetic unit 125 via the freewheeling unit 150.

Optionally, at 725, the controller 155 controls the first low side control unit 130 to switch off the connection of the first magnetic unit 120 with the reference voltage node 115 in response to the first current flowing through the first magnetic unit 120 being below the first threshold.

Optionally, at 730, the controller 155 may control the high side control unit 110 to switch on the connection of the second magnetic unit 125 with the power supply 105 by sending the control signal SH to the high side control unit 110 in a state in which the connection of the second magnetic unit 125 with the reference voltage node 115 is switched on.

Alternatively, in response to the second current flowing through the second magnetic unit 125 being greater than the second threshold, the controller 155 may control the high side control unit 110 to switch on the connection of the second magnetic unit 125 with the power supply 105.

Optionally, at 735, the controller 155 controls the high side control unit 110 to switch off the connection of the second magnetic unit 125 from the power supply 105 by the control signal SH in a state in which the connection of the second magnetic unit 125 with the reference voltage node 115 is switched on, such that the current in the second magnetic unit 125 flows through the freewheeling unit 150.

Alternatively, the controller 155 may control the operation of the high side control unit 110 based on the current flowing through the first magnetic unit 120.

Alternatively, the controller 155 may control the operation of the high side control unit 110 based on the current flowing through the second magnetic unit 125.

Optionally, the controller 155 may control the high side control unit 110 using a pulse width modulated signal. In this way, the current flowing through the first coil Ci and the second coil Ch may be controlled to stabilize around a certain value. Thus, the advantage of energy savings is achieved.

Alternatively, the controller 155 may adjust the duty cycle of the pulse width modulation signal based on at least one of the first current flowing through the first magnetic unit 120 and the second current flowing through the second magnetic unit 125.

Optionally, the freewheeling unit 150 comprises a first freewheeling unit 210 and a second freewheeling unit 220, wherein current flows in the first magnetic unit 120 via the first freewheeling unit 210 after controlling the high side control unit 110 to switch off the connection of the first magnetic unit 120 with the power supply 105, and wherein current flows in the second magnetic unit 125 via the second freewheeling unit 220 after controlling the second low side control unit 135 to switch on the connection of the contactor with the reference voltage node 115.

The present disclosure has the following benefits over the prior art. By using two magnetic units, the current flowing through the second magnetic unit 125 can be controlled to be small in the hold phase after the inrush phase for the contacts 12 to be closed. Power saving advantages may thus be achieved. At the same time, with the freewheeling unit 150, it is also possible to keep the current flowing in the magnetic unit without drawing power from the power supply. Thus, power consumption can be further reduced. Furthermore, the present disclosure uses a single high side control unit 110 to control both magnetic units such that the control device 100 can be simplified. This may not only save cost, but also make the associated control logic relatively simple.

The present disclosure provides an electronic smart contactor 10. The control unit 110 uses at least three switches. Thus, the pull-in and break of the contactor 10 may be well controlled while ensuring a reliable pull-in of the contactor 10. This reduces the switching frequency of the state of the contactor 10, reducing the number of contact collisions, thereby extending the useful life of the contacts and the contactor 10.

It is to be understood that the above detailed embodiments of the disclosure are merely for the purpose of illustrating or explaining the principles of the disclosure and are not limiting of the disclosure. Therefore, any modifications, equivalents, improvements within the spirit and principles of the present disclosure are intended to be included within the scope of the present disclosure. Also, it is intended that the appended claims cover all changes and modifications that fall within the scope and range of equivalents of the claims.

We claim:

1. A control device for a contactor, comprising:
a high side control unit configured to switch on or switch off a connection of a first magnetic unit and a second magnetic unit of the contactor with a power supply;
a first low side control unit configured to switch on or switch off a connection of the first magnetic unit with a reference voltage node;
a second low side control unit configured to switch on or switch off a connection of the second magnetic unit with the reference voltage node;
a freewheeling unit connected across a branch comprising the first magnetic unit and the first low side control unit and connected across a branch comprising the second magnetic unit and the second low side control unit; and
a controller configured to control operations of the high side control unit, the first low side control unit, and the second low side control unit to cause the control device to operate in an inrush phase and a hold phase,
wherein current flows through the first magnetic unit in the inrush phase and through the second magnetic unit in the hold phase.

2. The control device of claim 1, further comprising:
a first current monitor configured to monitor a first current flowing through the first magnetic unit, wherein the controller is configured to control the operation of the high side control unit or the first low side control unit based on the first current.

3. The control device of claim 1, further comprising:
a second current monitor configured to monitor a second current flowing through the second magnetic unit, wherein the controller is configured to control the operation of the high side control unit based on the second current.

4. The control device of claim 1, wherein the freewheeling unit comprises a first freewheeling unit and a second freewheeling unit, the first freewheeling unit is connected across a branch comprising the first magnetic unit and the first low side control unit and the second freewheeling unit is connected across a branch comprising the second magnetic unit and the second low side control unit.

5. The control device of claim 1, wherein the freewheeling unit comprises a freewheeling diode.

6. The control device of claim 1, wherein:
the first magnetic unit comprises a first coil;
the second magnetic unit comprises a second coil;
the high side control unit comprises a high side switch connected between the first and second coil and the power supply;
the first low side control unit comprises a first low side switch connected between the first coil and the reference voltage node; and
the second low side control unit comprises a second low side switch connected between the second coil and the reference voltage node.

7. The control device of claim 1, further comprising a first voltage regulation unit and a second voltage regulation unit, the first voltage regulation unit is connected between the first magnetic unit and the reference voltage node, and the second voltage regulation unit is connected between the second magnetic unit and the reference voltage node.

8. A contactor comprising the control device of claim 1.

9. A method of controlling a contactor, comprising:
controlling a first low side control unit to switch on a connection of a first magnetic unit of the contactor with a reference voltage node;
controlling a high side control unit to switch on a connection of the first magnetic unit with a power supply such that current flows through the first magnetic unit;
controlling the high side control unit to switch off the connection of the first magnetic unit with the power supply such that current flows in the first magnetic unit via a freewheeling unit; and
controlling a second low side control unit to switch on a connection of a second magnetic unit of the contactor with the reference voltage node such that current flows in the second magnetic unit via the freewheeling unit.

10. The method of claim 9, further comprising:
controlling the first low side control unit to switch off the connection of the first magnetic unit with the reference voltage node in response to a first current flowing through the first magnetic unit being below a first threshold.

11. The method of claim 9, further comprising:
controlling the high side control unit to switch on the connection of the second magnetic unit with the power supply in a state in which the connection of the second magnetic unit with the reference voltage node is switched on.

12. The method of claim 11, further comprising:
controlling the high side control unit to switch off the connection of the second magnetic unit with the power supply such that current flows in the second magnetic unit via the freewheeling unit.

13. The method of claim 11, wherein controlling the high side control unit to switch on the connection of the second magnetic unit with the power supply in the state in which the connection of the second magnetic unit with the reference voltage node is switched on comprises:
in response to a second current flowing through the second magnetic unit being greater than a second threshold, controlling the high side control unit to switch on the connection of the second magnetic unit with the power supply.

14. The method of claim 9, further comprising:
controlling an operation of the high side control unit based on a current flowing through the first magnetic unit.

15. The method of claim 9, further comprising:
controlling the operation of the high side control unit based on current flowing through the second magnetic unit.

16. The method of claim 9, further comprising:
controlling the high side control unit by using a pulse width modulation signal.

17. The method of claim 16, further comprising:
adjusting a duty cycle of the pulse width modulation signal based on at least one of a first current flowing through the first magnetic unit and a second current flowing through the second magnetic unit.

18. The method of claim 9, wherein the freewheeling unit comprises a first freewheeling unit and a second freewheeling unit,
wherein after controlling the high side control unit to switch off the connection of the first magnetic unit with the power supply, current flows in the first magnetic unit via the first freewheeling unit, and
wherein after controlling the second low side control unit to switch on the connection of the second magnetic unit of the contactor with the reference voltage node, current flows in the second magnetic unit via the second freewheeling unit.

* * * * *